(12) United States Patent
Yu et al.

(10) Patent No.: US 11,610,043 B2
(45) Date of Patent: Mar. 21, 2023

(54) MACHINE LEARNING BASED MODEL BUILDER AND ITS APPLICATIONS FOR PATTERN TRANSFERRING IN SEMICONDUCTOR MANUFACTURING

(71) Applicant: TAIWAN SEMICONDUCTOR MANUFACTURING CO., LTD., Hsinchu (TW)

(72) Inventors: Zhiru Yu, San Jose, CA (US); Lin Zhang, Hsinchu (TW); Danping Peng, Fremont, CA (US); Junjiang Lei, Fremont, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/193,625

(22) Filed: Mar. 5, 2021

(65) Prior Publication Data
US 2022/0284166 A1 Sep. 8, 2022

(51) Int. Cl.
*G06F 30/398* (2020.01)
*G03F 7/20* (2006.01)

(52) U.S. Cl.
CPC ............ *G06F 30/398* (2020.01); *G03F 7/705* (2013.01)

(58) Field of Classification Search
CPC ........ G03F 1/36; G03F 7/705; G03F 7/70091; G03F 7/70283; G03F 1/70; G03F 1/84; G03F 1/80; G03F 7/70125; G03F 7/70441; G03F 1/26; G03F 1/30; G03F 1/68; G03F 7/70425; G03F 7/70433; G03F 7/70466; G03F 7/70516; G03F 7/70558; G03F 7/70083; G03F 7/70625; G03F 7/70633; G03F 1/78; H01L 21/31144; H01L 21/76811; H01L 23/528; H01L 27/0207; H01L 21/027; H01L 21/67005; G06F 30/398; G06F 30/367; G06F 30/30; G06F 30/20; G06F 2115/06; G06F 2119/18; G06F 30/39; G06F 30/392; G06F 30/00; G06F 17/18; G06T 2207/30148; G06T 2207/10056

USPC .................................................. 716/50–56

See application file for complete search history.

(56) References Cited

U.S. PATENT DOCUMENTS

| | | | |
|---|---|---|---|
| 8,796,666 | B1 | 8/2014 | Huang et al. |
| 8,954,899 | B2 | 2/2015 | Wu et al. |
| 9,093,530 | B2 | 7/2015 | Huang et al. |
| 9,367,655 | B2 | 6/2016 | Shih et al. |
| 9,390,217 | B2 | 7/2016 | Wang et al. |

(Continued)

FOREIGN PATENT DOCUMENTS

TW 201944174 A 11/2019

*Primary Examiner* — Binh C Tat
(74) *Attorney, Agent, or Firm* — McDermott Will & Emery LLP

(57) ABSTRACT

A system and a method of optimizing an optical proximity correction (OPC) model for a mask pattern of a photo mask is disclosed. A machine learning (ML) based model builder includes an OPC model, measurement data and a random term generator. Random terms are generated in a M-dimensional space by the random term generator. The ML based model builder classifies the random terms to clusters by applying a classifying rule. A representative subset of the random terms is determined among the classified clusters, and the representative subset is added to the OPC model.

20 Claims, 13 Drawing Sheets

(56) References Cited

U.S. PATENT DOCUMENTS

| | | | |
|---|---|---|---|
| 9,548,303 B2 | 1/2017 | Lee et al. | |
| 9,594,862 B2 | 3/2017 | Lin et al. | |
| 9,679,100 B2 | 6/2017 | Cheng et al. | |
| 9,865,542 B2 | 1/2018 | Liaw et al. | |
| 9,870,443 B2 | 1/2018 | Huang et al. | |
| 10,671,786 B2* | 6/2020 | Lai | G03F 7/70441 |
| 11,156,916 B2 | 10/2021 | Hatakeyama et al. | |
| 2007/0186206 A1* | 8/2007 | Abrams | G03F 1/36 |
| | | | 716/54 |
| 2012/0221984 A1* | 8/2012 | DeMaris | G03F 7/70125 |
| | | | 716/54 |
| 2018/0150578 A1* | 5/2018 | Lai | G03F 7/705 |

* cited by examiner

OPC Model 122 = Optical Model 125 + Resist Model 127

FIG. 3

MACHINE LEARNING BASED MODEL BUILDER AND ITS APPLICATIONS FOR PATTERN TRANSFERRING IN SEMICONDUCTOR MANUFACTURING

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as IC technologies are continually progressing to smaller technology nodes simply scaling down similar designs used at larger feature sizes often results in poorly shaped device features. Rounded corners on a device feature that is designed to have right-angle corners may prevent the device from performing as desired. Other examples of inaccurate feature formation include pinching, necking, bridging, dishing, erosion, metal line thickness variations, and other characteristics that affect device performance. Typically, optical proximity correction (OPC) may be performed on a design pattern before the pattern is created on a mask. However, current OPC techniques may not offer great enough fidelity to correct problems in current designs. Therefore, existing methods for improving IC manufacturing have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 is a schematic view of an optical proximity correction (OPC) model according to some embodiments of the present disclosure.

DETAILED DESCRIPTION

Figure 1A:
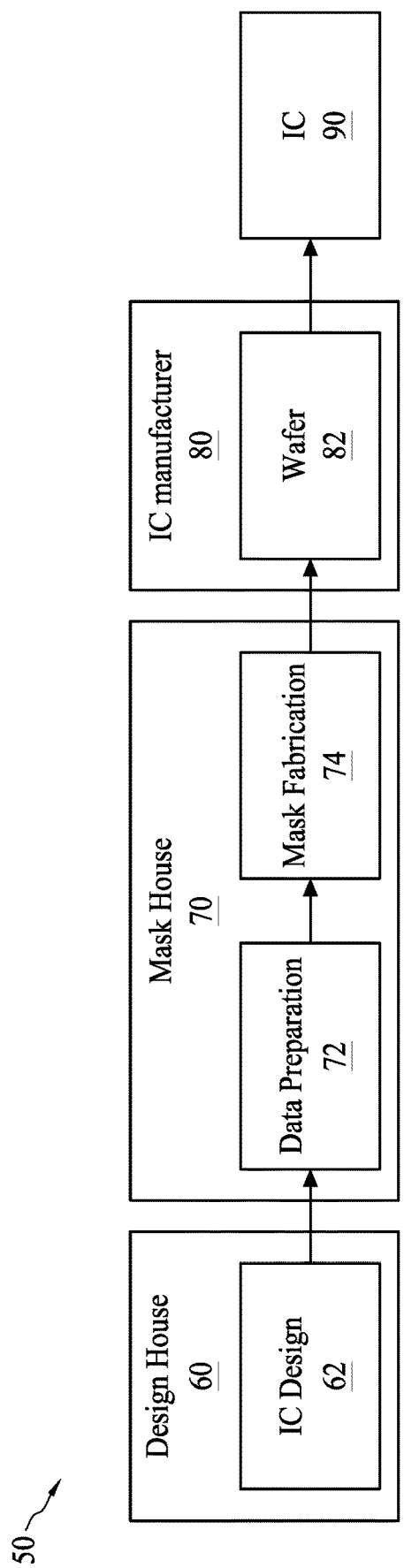
FIG. 1A is a simplified block diagram of an integrated circuit (IC) manufacturing system and an IC manufacturing flow associated with the IC manufacturing system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

FIG. 1A is a simplified block diagram of an integrated circuit (IC) manufacturing system 50 and an IC manufacturing flow associated with the IC manufacturing system. The IC manufacturing system 50 includes a plurality of entities, such as a design house 60, a mask house 70, and an IC manufacturer 80 (i.e., a fab), that interact with one another in the design, development, and manufacturing cycles and/or services related to manufacturing an integrated circuit (IC) device 90. The plurality of entities are connected by a communications network, which may be a single network or a variety of different networks, such as an intranet and the internet, and may include wired and/or wireless communication channels. Each entity may interact with other entities and may provide services to and/or receive services from the other entities. The design house 60, mask house 70, and IC manufacturer 80 may be a single entity or separate entities.

The design house (or design team) 60 generates an IC design layout 62. The IC design layout 62 includes various geometrical patterns designed for an IC product, based on a specification of the IC product to be manufactured. The geometrical patterns correspond to patterns of metal, oxide, or semiconductor layers that make up the various components of the IC device 90 to be fabricated. The various layers combine to form various IC features. For example, a portion of the IC design layout 62 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 60 implements a proper design procedure to form the IC design layout 62. The design procedure may include logic design, physical design, and/or place and route. The IC design layout 62 is presented in one or more data files having information of the geometrical patterns.

The mask house 70 uses the IC design layout 62 to manufacture one or more masks to be used for fabricating the various layers of the IC product according to the IC design layout 62. The mask house 70 performs mask data preparation 72, where the IC design layout 62 is translated into a form that can be physically written by a mask writer, and mask fabrication 74, where the design layout prepared by the mask data preparation 72 is modified to comply with a particular mask writer and/or mask manufacturer and is then fabricated. In the present embodiment, the mask data preparation 72 and mask fabrication 74 are illustrated as separate elements, however, the mask data preparation 72 and mask fabrication 74 can be collectively referred to as mask data preparation. After mask data preparation 72 and during mask fabrication 74, a mask or group of masks are fabricated based on the modified IC design layout.

Figure 1B:
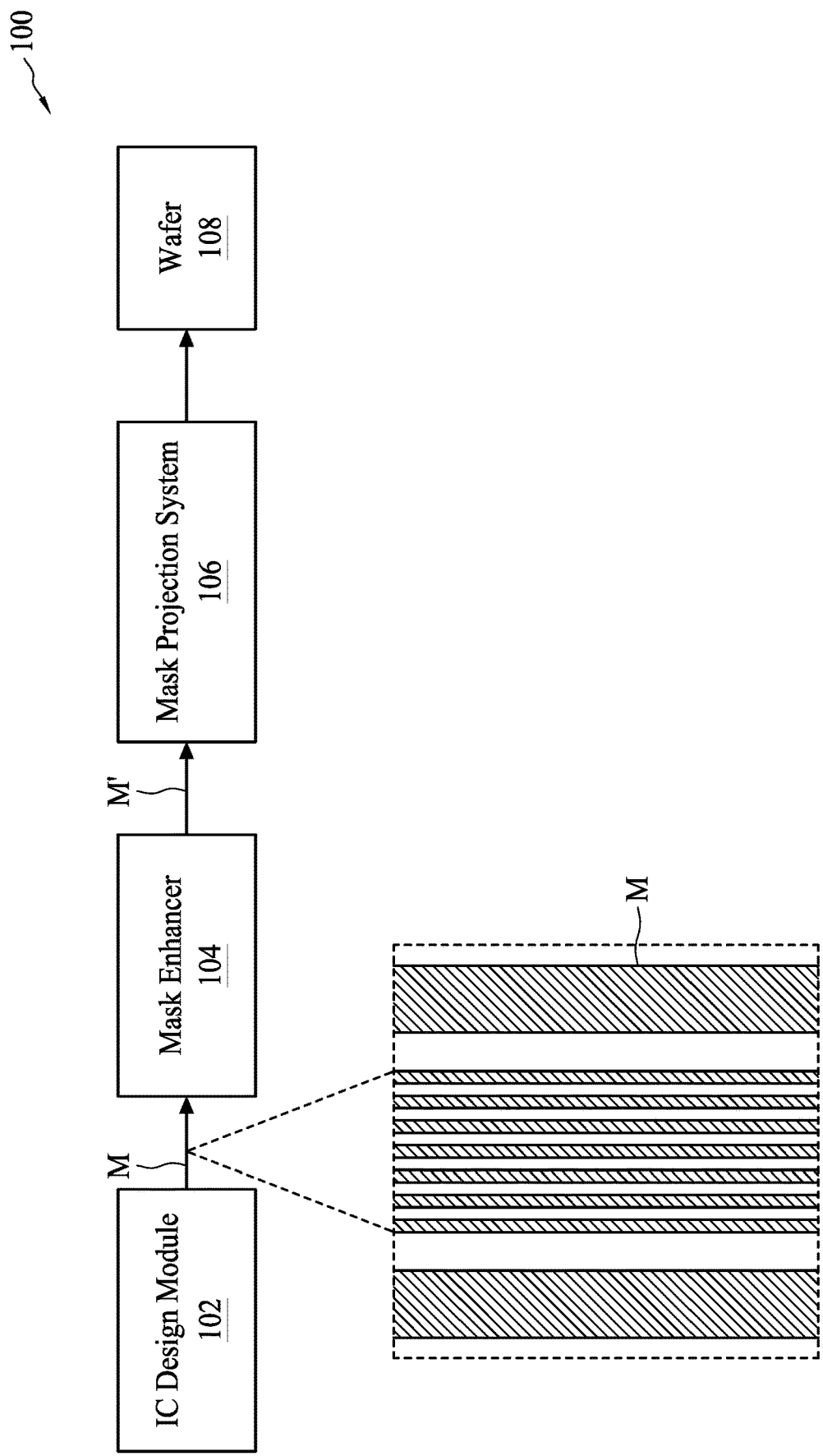
FIG. 1B illustrates a schematic diagram of an exemplary integrated circuit (IC) fabrication flow according to some embodiments of the present disclosure.

FIG. 1B illustrates a schematic diagram of an exemplary integrated circuit (IC) fabrication flow 100. The IC fabrication flow 100 begins with an IC design module 102 that provides layout patterns M, e.g., target layout patterns, that will be produced as a resist pattern of an IC product on the wafer. The IC design module 102 generates various layout shapes, e.g., geometrical patterns, based on the specification of the IC product for different steps of processing the IC product. In some embodiments, the layout patterns M are presented by one or more data files having the information of the geometrical patterns. In some embodiments, optically projecting the layout pattern of the photo mask to the wafer in the lithographic process degrades the layout pattern of the photo mask and generates pattern defects on the resist layer on the wafer. An optical proximity correction (OPC) operation may be applied to layout patterns of the photo mask to reduce the pattern defects on the wafer. The OPC may modify the layout patterns of the photo mask before the lithography process to compensate for the effect of the lithography and/or etching processes. The IC fabrication flow 100 also shows a mask enhancer 104. As will be described in more detail below with respect to FIG. 2, the mask enhance process 104 performs the OPC in some embodiments. The mask enhance process 104 creates an OPCed (e.g., a corrected or enhanced) layout pattern M' on the photo mask. In some embodiments, the enhanced layout pattern M' is presented by one or more data files having the information of the enhanced geometrical patterns.

The IC fabrication flow 100 further shows a mask projection system 106. In some embodiments, the mask projection system 106 produces the enhanced layout patterns M' on the photo mask. In some embodiments, the mask projection system 106 performs two functions. As a first function, the mask projection system 106 uses the data files of the enhanced layout pattern M' and uses an electron beam to generate the enhanced layout pattern M' on a mask blank (not shown) to produce the photo mask for the ICs. In addition, and as a second function, the mask projection system 106 optically projects the enhanced layout pattern M' of the photo mask on the wafer 108 to produce the IC layouts on the wafer 108.

Figure 2:
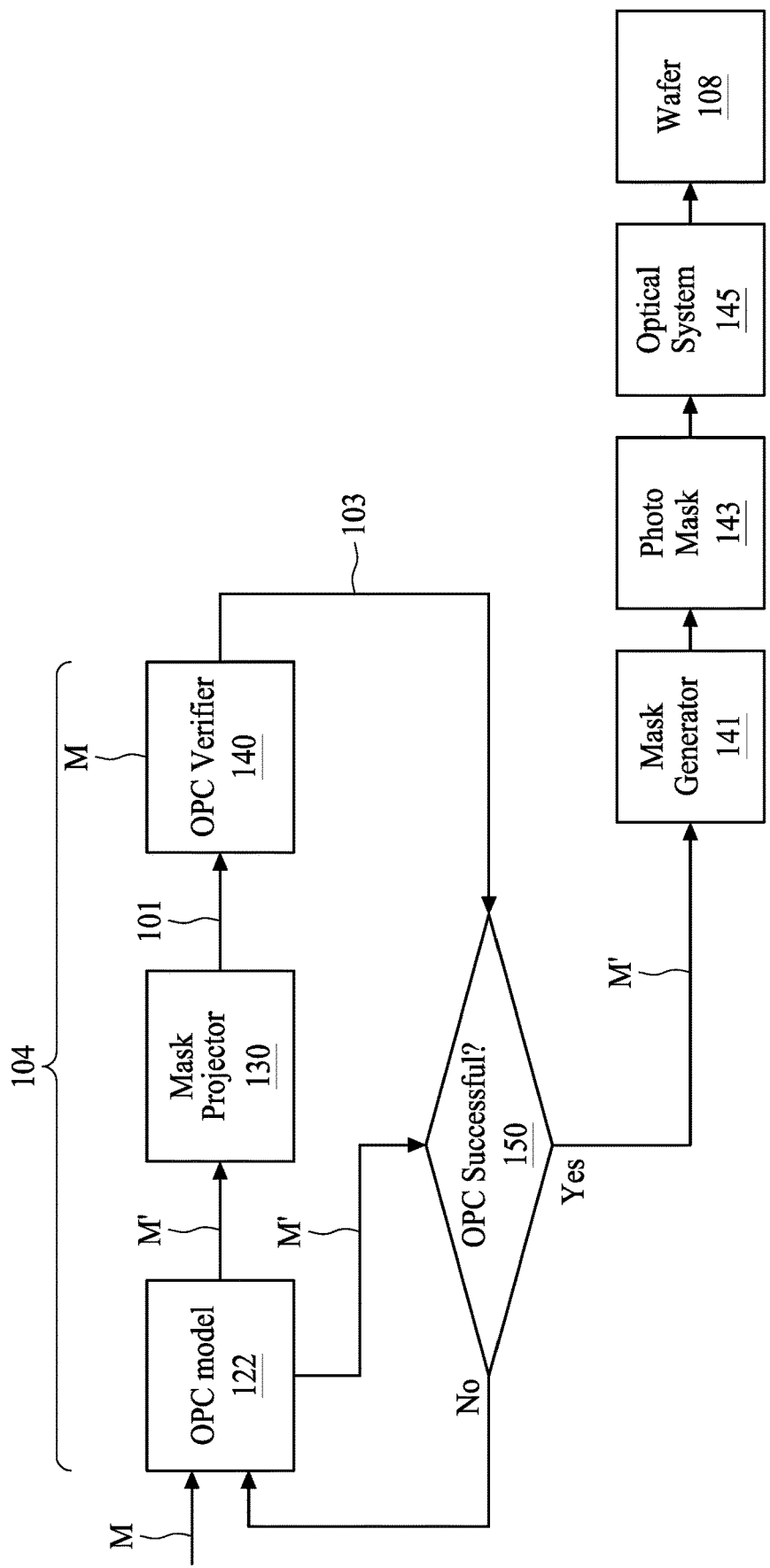
FIG. 2 illustrates a schematic diagram of an exemplary mask enhancing process according to some embodiments of the present disclosure.

FIG. 2 illustrates a schematic diagram of the mask enhance process 104 that receives the target layout pattern M as an input of an optical proximity correction (OPC) model 122 and produces the enhanced layout pattern M' at an output of the operation 150. The mask enhance process 104 performs an iterative process. In some embodiments, the mask enhance process 104 includes an OPC model 122 that receives, from the IC design module 102, the target layout pattern M that will be produced on the wafer 108. The OPC model 122 performs enhancements on the target layout pattern M and produces the OPCed (e.g., the corrected or enhanced) layout pattern M'. As described, OPC is a lithography technique that is used to correct or enhance the layout pattern M and to add improved imaging effects to a target layout pattern M such that the OPCed layout pattern M' reproduces, on the wafer 108, the target layout pattern M. For example, OPC is used to compensate for imaging distortions due to optical diffraction. In some embodiments, the target layout pattern M is a data file having the information of the geometrical patterns to be produced on the wafer 108, and the OPC model 122 modifies the data file and produces a corrected data file representing the enhanced layout pattern M'. In some embodiments, the target layout pattern M and the enhanced layout pattern M' are represented by the vertices of the layout patterns in the data files. Thus, in some embodiments, the rounded corners and the bends are represented by a curvilinear shape having multiple vertices and multiple line segments connecting the vertices and the curvilinear shape is represented by the multiple vertices in the data file.

FIG. 2 further shows a mask projector 130, e.g., a simulator for mask projection, that is applied to the enhanced layout pattern M' to produce a projected resist pattern 101 on the wafer. In some embodiments, the enhanced layout pattern M' is a data file and the optical simulator 130 simulates the projection of the enhanced layout pattern M' on the wafer and produces the simulated projected resist pattern 101. The projected resist pattern 101 is inspected by an OPC verifier 140 for errors. In some embodiments, the OPC verifier 140 receives the target layout pattern M in addition to the projected resist pattern 101 and compares the projected resist pattern 101 with the target layout pattern M to find errors between target layout pattern M and the projected resist pattern 101. In some embodiments, the OPC verifier 140 verifies the enhanced, e.g., OPCed, layout pattern M' when the error between the target layout pattern M and the projected resist pattern 101 is below a threshold level and there are no defects, e.g., a bridge or narrowing, in the projected resist pattern. In some embodiments, after verifying the enhanced layout pattern M', the OPC verifier 140 generates and sends a verification signal 103. In some embodiments, the OPC verifier 140 stores the enhanced layout pattern M' in a database. In some embodiments, instead of a simulated result, a photo resist pattern is formed by using a photo mask fabricated with the enhanced layout pattern M' and the shapes and dimensions of the resist patterns are measured and are fed-back to the OPC model 122.

The verification signal 103 is tested at step 150 and if the verification signal 103 is not successful, e.g., the error is above the threshold level or defects exist in the projected resist pattern 101, iterations continue by applying further OPC enhancements by the OPC model 122. The iterations continue until the verification signal 103 is successful. When the verification signal 103 is successful, the enhanced layout pattern M' is provided as the output of the mask enhance process 104. In some embodiments, the error between the target layout pattern M and the projected resist pattern 101 is defined as a distance between the boundary of the target layout pattern M and a boundary of the projected resist pattern 101.

As shown, in addition to the mask enhance process 104, FIG. 2 includes a mask generator 141 and a photo mask 143. In some embodiments, the enhanced layout pattern M' is sent as a data file to the mask generator 141. The mask generator 141 produces the enhanced layout pattern M' on a mask-blank to generate a photo mask 143. In some embodiments, the photo mask 143 is used by the optical system of a photo lithography system to produce a resist pattern in a resist layer of the wafer.

The OPC verifier 140 measures the processing parameters that are implemented by the IC manufacturer to fabricate the IC device. The OPC verifier 140 measures this processing based on a "known mask pattern" of the IC design layout 62 to create a wafer measurement data 142 by a manufacturing device, such as a lithography scanner and metrology tools. In some embodiments, the OPC verifier 140 simulates processing of the modified IC design layout to create the wafer measurement data 142 by the manufacturing device. Accordingly, the modified IC design layout is also referred to as the OPCed IC design layout. The OPC verifier 140 uses one or more OPC models (or rules). The OPC models (or rules) may be based on actual processing parameters of the IC manufacturer 80. The processing parameters can include parameters associated with various processes of the IC manufacturing cycle, parameters associated with tools used for manufacturing the IC, and/or other aspects of the manufacturing process. The OPC verifier 140 takes into account various factors, such as aerial image ("AI") contrast, depth of focus ("DOF"), mask error sensitivity ("MEEF"), other suitable factors, or combinations thereof.

Referring to FIG. 3, the optical proximity correction (OPC) model includes an optical model 125 and a resist model 127. The optical model 125 defines the performance by the optical components of lithography system, and the resist model 127 defines the performance by the resist being utilized in the given process.

The optical model 125 is formulated based on optical properties related to, for example, the lithography scanner tool and its related adjustable parameters. In some embodiments, the optical model 125 is written as a function of $f(o_1, o_2, o_3, \ldots)$, where $o_1, o_2, o_3, \ldots, o_i$ are optical parameters associated with the lithography scanner tool. The optical model 125 including the optical parameters is applied to the mask image to compute a simulated aerial image (AI) 126. The optical parameters of the photo-resist layer coated on a substrate such as, for example, refractive index, film thickness, propagation and polarization effects—may also be captured as part of the optical model 125.

The resist model 127 is formulated by empirical functions. As an example, the resist model 127 may be, but not limited to, distortions of optical images generated by the optical model and/or an inputting photo mask patterns. In some embodiments, the resist model 127 is written as a function of $g(AI, M) = h(AI) + m(M)$ and $h(AI) = a_1 h_1(AI, n_1^1, n_2^1, \ldots) + a_2 h_2(AI, n_1^2, n_2^2, \ldots) + \ldots$, $m(M) = b_1 m_1(M, k_1^1, k_2^1, \ldots) + b_2 m_2(M, k_1^2, k_2^2, \ldots) + \ldots$, where $h(AI)$ and $m(M)$ are an optical image and a mask pattern dependent functions, respectively. In this function, $h_1(AI, n_1^i, n_2^i, \ldots)$ and $m_1(M, k_1^i, k_2^i, \ldots)$ are individual resist model terms that can be used to describe certain physical effects on a resist model. Finally, $a_i$ and $b_i$ are coefficient numbers used for each of the resist model terms. In some embodiments, in order to form a good OPC model, it is important to choose the appropriate resist model terms $h_i$ and $m_i$ with proper coefficients, $a_i$ and $b_i$.

Figure 4:
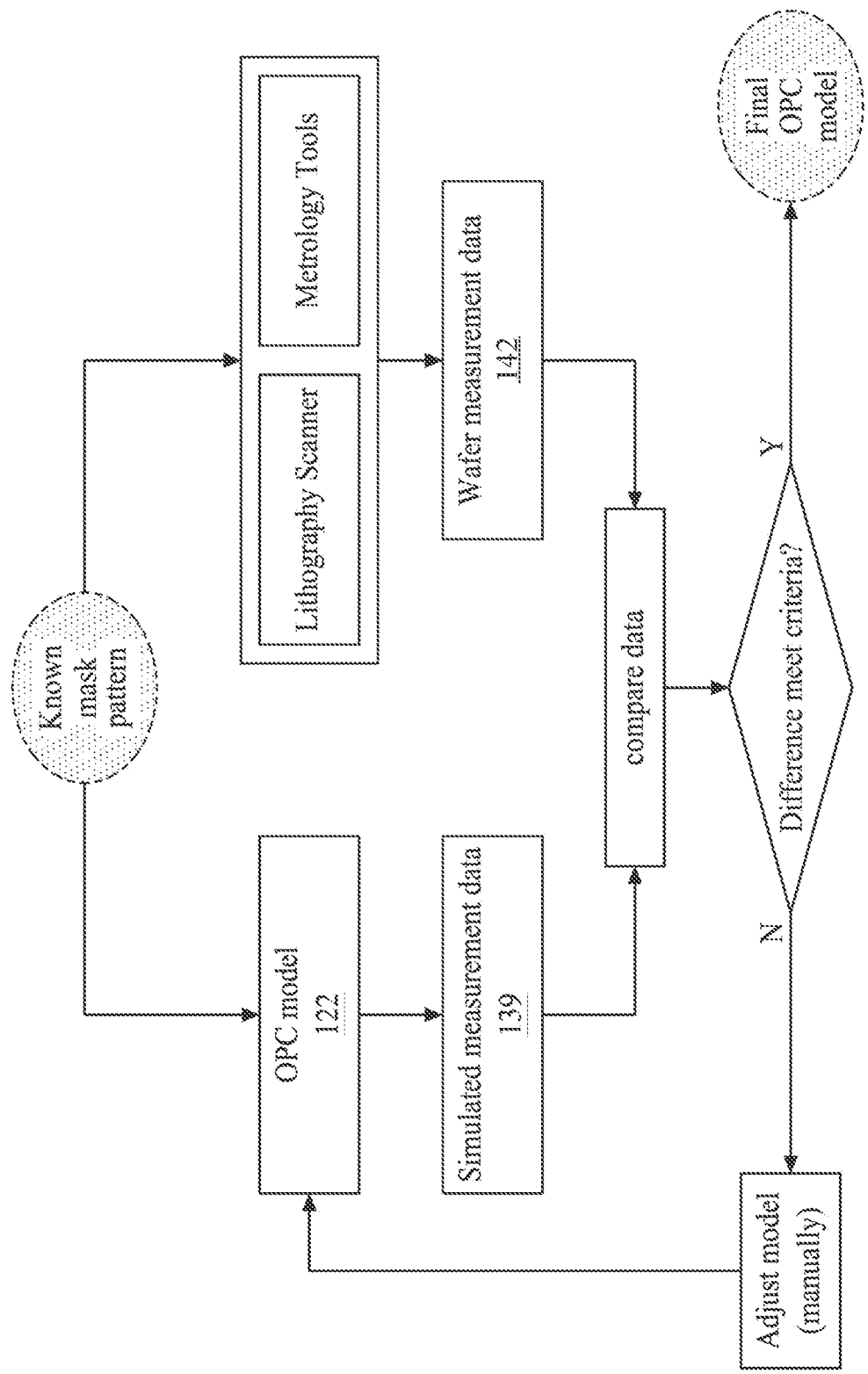
FIG. 4 schematically illustrates a process generating the OPC model in accordance with one or more embodiments of the present disclosure.

FIG. 4 illustrates a flow chart of generating an OPC model. In some embodiments, as shown in FIG. 4, simulated measurement data 139 are generated by the OPC model 122, and wafer measurement data 142 are generated by the devices such as, a lithography scanner and the metrology tools from a known mask pattern. The wafer measurement data 142 are a reference data set corresponding to the simulated measurement data 139 by the OPC model 122, and a final OPC model is selected by comparing both measurement data to determine whether the differences meet design criteria. If the differences/errors between the simulated measurement data 139 and the wafer measurement data 142 do not meet design requirements, then one or more parameters of the OPC model are adjusted and fed-back to the OPC model 122 until the process meets the design criteria/requirement, and a final OPC model is selected. An initial OPC model is provided from older technology nodes and/or selected by OPC engineer empirically in some embodiments. If the simulated measurement data do not match the wafer measurement data, then the OPC model needs to be adjusted. Adjusting the OPC model requires input from the OPC engineer in some embodiments.

Figure 5A:
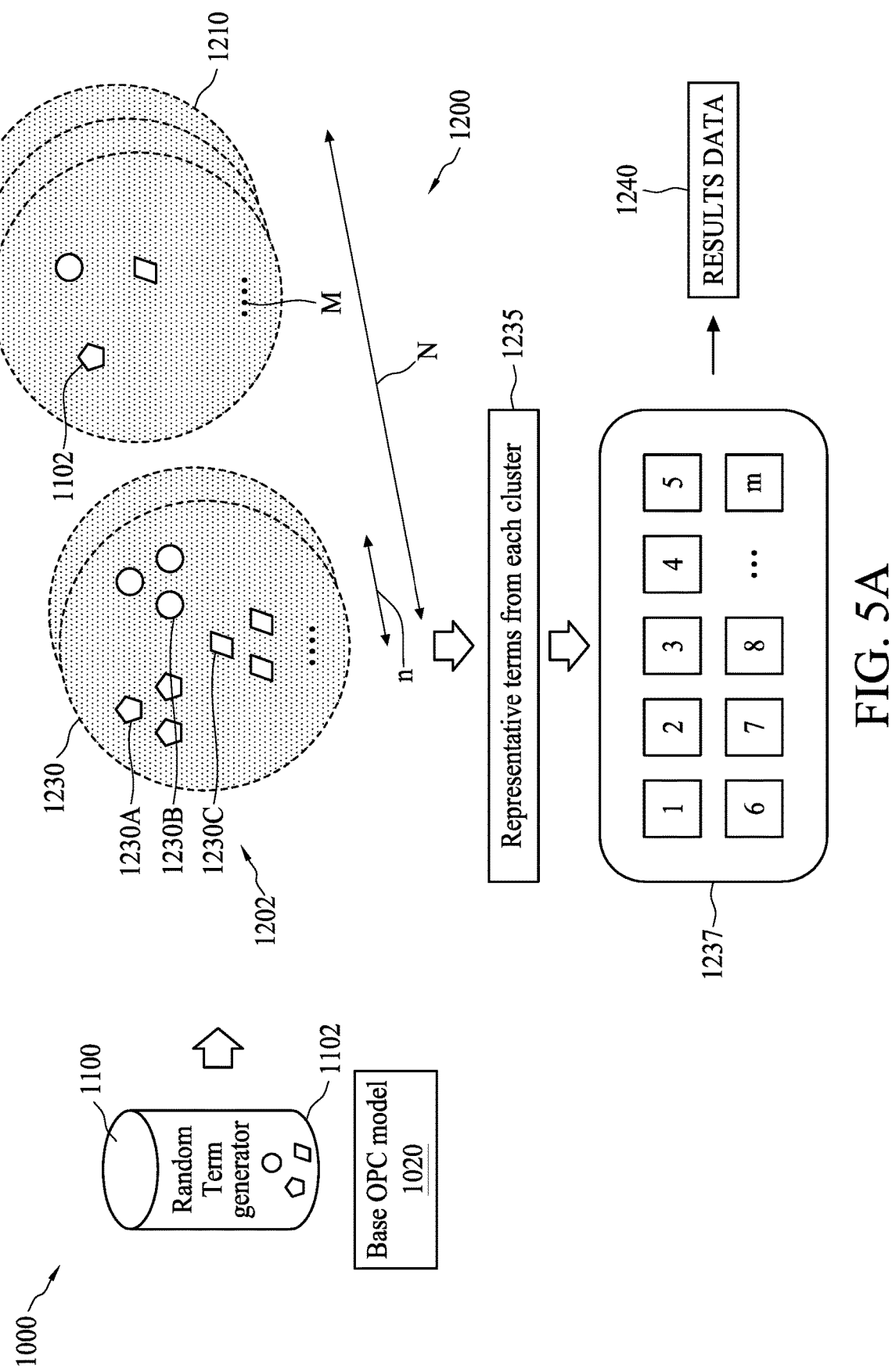
FIG. 5A illustrates a schematic diagram of generating a classified representative subset by a Machine Learning (ML) based model builder in accordance to some embodiments of the present disclosure.

FIG. 5A illustrates a schematic diagram of generating a classified representative subset by a machine learning (ML) based model builder in according to some embodiments of the present disclosure. The ML based model builder 1000 is configured to select OPC model terms by taking a new perspective, a machine learning, utilizing machine learning technologies, such as clustering, feature selection, subset selection, and dimensionality reduction. The ML based model builder 1000 differs from other machine learning methodologies, because the ML based model builder 1000 uses the physics of the process to be modeled by incorporating the domain knowledge in the selection process. Thus, the ML based model builder 1000 leads to a more physical and automated selection process, without any determination by the user required in the term selection process.

As shown in FIG. 5A, the ML based model builder 1000 includes a random term generator 1100 and a classifying processor 1200. The random term generator 1100 is configured to generate a large number (N) of random terms 1102. In some embodiments, the random terms 1102 generated by the random term generator 1100 are functions and coefficients such as, $h_i(AI)$ or $m_i(M)$ with random parameters. In some embodiments, the random terms 1102 generated by the random term generator 1100 are convoluted terms, such as $h_i(AI) \otimes m_j(M)$. The classifying processor 1200 uses the large number (N) of random terms 1102 to generate results data 1240 by way of optical proximity correction (OPC) clusters 1230, representative terms 1235 from each clusters, and a representative subset 1237 of the random terms 1102 generated by the random term generator 1100. In some embodiments, the large number (N) is in a range from about 1,000 to about 1,000,000. In a particular embodiment, the large number (N) is 10,000.

The ML based model builder 1000 starts with a base OPC model 1020, a basic and physical OPC model, such as, an optical model for micro-lithography simulation. The base OPC model 1020 is obtained from a domain knowledge and physical settings of a lithography process, in some embodiments. It is noted that, in some embodiments, a "term" means a deformation of the base OPC model 1020. In such a configuration, the OPC model includes the base OPC model 1020 and a collection of the terms.

As described above, the random term generator 1100 generates the large number (N) of random terms 1102. The ML based model builder 1000 instantiate each of the random terms 1102 as sample points 1202 in an M-dimensional sample space 1210 defined by "M" number of selected gauges (namely, "M" measurement points). Here, "N" represents a total number of random terms 1102, and "M" represents a total number of measurement points. In other words, the ML based model builder 1000 generates N-random terms 1102 scattered in M-dimensional space 1210, and N and M are not necessarily equal. In some embodiments, N is about 10,000 and M is about 1,000,000.

The ML based model builder 1000 then maps the M-dimensional sample points (the large number (N) of random terms 1102) to a low "n" number of dimensional space 1220 (n<<N) by using, for example, dimensionality reduction techniques such as stochastic neighbor embedding (sne), t-distributed stochastic neighbor embedding (t-sne), uniform manifold approximation and projection (u-map) or principal component analysis (PCA). In some embodiments, the low number (n) is in a range from about 1 to about 10. In a particular embodiment, the low number (n) is about 3. In this operation, the ML based model builder 1000 generates an n-dimensional space 1220 that includes a plurality of the sample points 1202 such as 1230A, 1230B and 1230C.

The ML based model builder 1000 then classifies all the terms in the form of the sample points in the n-dimensional space 1220 into "m" number of clusters by using, for example, a k-mean cluster. In other words, the ML based model builder 1000 generates optical proximity correction (OPC) clusters 1230.

The ML based model builder 1000 then selects one or more representative terms from each of the OPC clusters 1230. In some embodiments, the representative terms 1235 are selected based on its impact on the OPC model. In other words, the optical proximity correction (OPC) clusters 1230 are aggregated into a plurality of classified clusters such as, for example, 1230A, 1230B, and 1230C, to get representative terms 1235 from each of the OPC clusters 1230. The plurality of classified clusters 1230A, 1230B, and 1230C are selected from the group consisting of a geographic center method, a moving average (rolling average) method, a data sampling rate method, a data magnification factor method, a data smoothing filter method, and/or types of a sensor method, in some embodiments. In some embodiments, the plurality of classified clusters 1230A, 1230B, and 1230C are selectively adjusted. For example, in various different embodiments, new classifying methods can be added into the plurality of classified clusters 1230A, 1230B, and 1230C. In some embodiments, one or more existing classified clusters are removed from the plurality of classified clusters 1230A, 1230B, and 1230C. In some alternative embodiments, one or more classifying methods are adjusted to update the plurality of classified clusters 1230A, 1230B, and 1230C.

In some embodiments, the optical proximity correction (OPC) clusters 1230 are, for example, machine-learning methods that predict future behaviors and responses. In some embodiments, the optical proximity correction (OPC) clusters 1230 are combined clusters. The use of the combined clusters can provide a simple and effective solution at minimum complexity and expense for processing a sparse and small data set.

The ML based model builder 1000 then generates the representative subset 1237 that includes representative terms 1235 from each of the OPC clusters 1230. In some embodiments, the representative subset 1237 includes one or more representative terms 1235 from each of the OPC clusters 1230. In some embodiments, the representative subset 1237 are sorted in terms of their impact on the OPC model.

Then, the ML based model builder 1000 evaluates the performance against all physical measurements, i.e., for all the M terms. The ML based model builder 1000 determines a performance of the representative subset 1237 on the OPC model. In some embodiments, in response to the determination of the performance, the ML based model builder 1000 automatically adjusts the representative subset 1237 associated with the OPC model until the performance of the representative subset meets a design requirement. When the ML based model builder 1000 determines that performance of the representative subset meets a design requirement, the ML based model builder 1000 includes the terms with the best performance and provides the OPC model as the optimized (OPC) model.

Figure 5B:
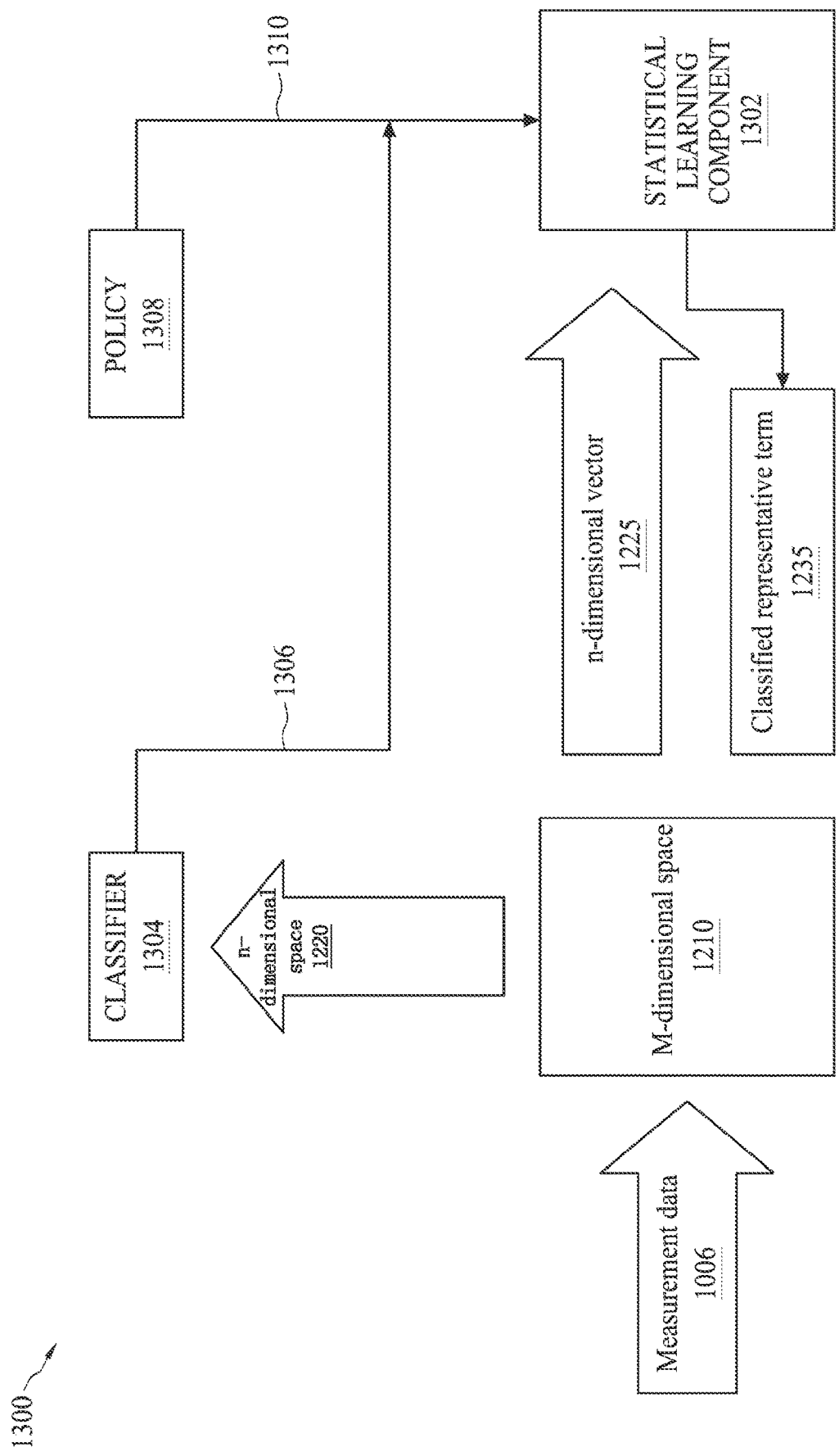
FIG. 5B illustrates a block diagram of a machine learning module of the ML based model builder in accordance with one or more embodiments of the present disclosure.

FIG. 5B illustrates a block diagram of non-limiting examples a machine learning module 1300 of the ML based model builder in accordance with one or more embodiments described herein. The machine learning module 1300 includes a statistical learning component 1302, a classifier 1304, and a policy 1308.

As previously described, the ML based model builder 1000 generates the M-dimensional space 1210 that includes the large number (N) of random terms. The machine learning module 1300 receives a measurement data 1006 including the simulated measurement data 139 and the wafer measurement data 142. The n-dimensional space 1220 is generated by the ML based model builder 1000 based on the M-dimensional space 1210 that includes the plurality of the sample points. The n-dimensional space 1220 is provided to a classifier 1304. The classifier 1304 may review any combination of the particular optical model parameters. The classifier 1304 generates a classifier decision 1306 based on the input.

The statistical learning component 1302 receives a policy data 1310 generated by the policy 1308. The policy data 1310 represents a weighting policy associated with the machine learning module 1300. In some embodiments, this weighting policy can be indicative of a weighting of importance. For example, the policy data 1310 is generated in response to input criteria that is manipulated and/or modified to a value between values on two opposing sides (or preferences), one corresponding to decreasing positives and one corresponding to increasing positives.

In some embodiments, the ML based model builder 1000 provide measurement data 1006 to the M-dimensional space to derive an n-dimensional vector data 1225. The n-dimensional vector data 1225 represents the convoluted terms such as $h_i(AI) \otimes m_j(M)$ of interest with respect to a set of attributes derived from the measurement data 1006.

In some embodiments, a feedback system/mechanism provided in some embodiments further sends a notification based on a based on a new data match information indicating whether the data match is within the acceptable data match range.

Figure 6:
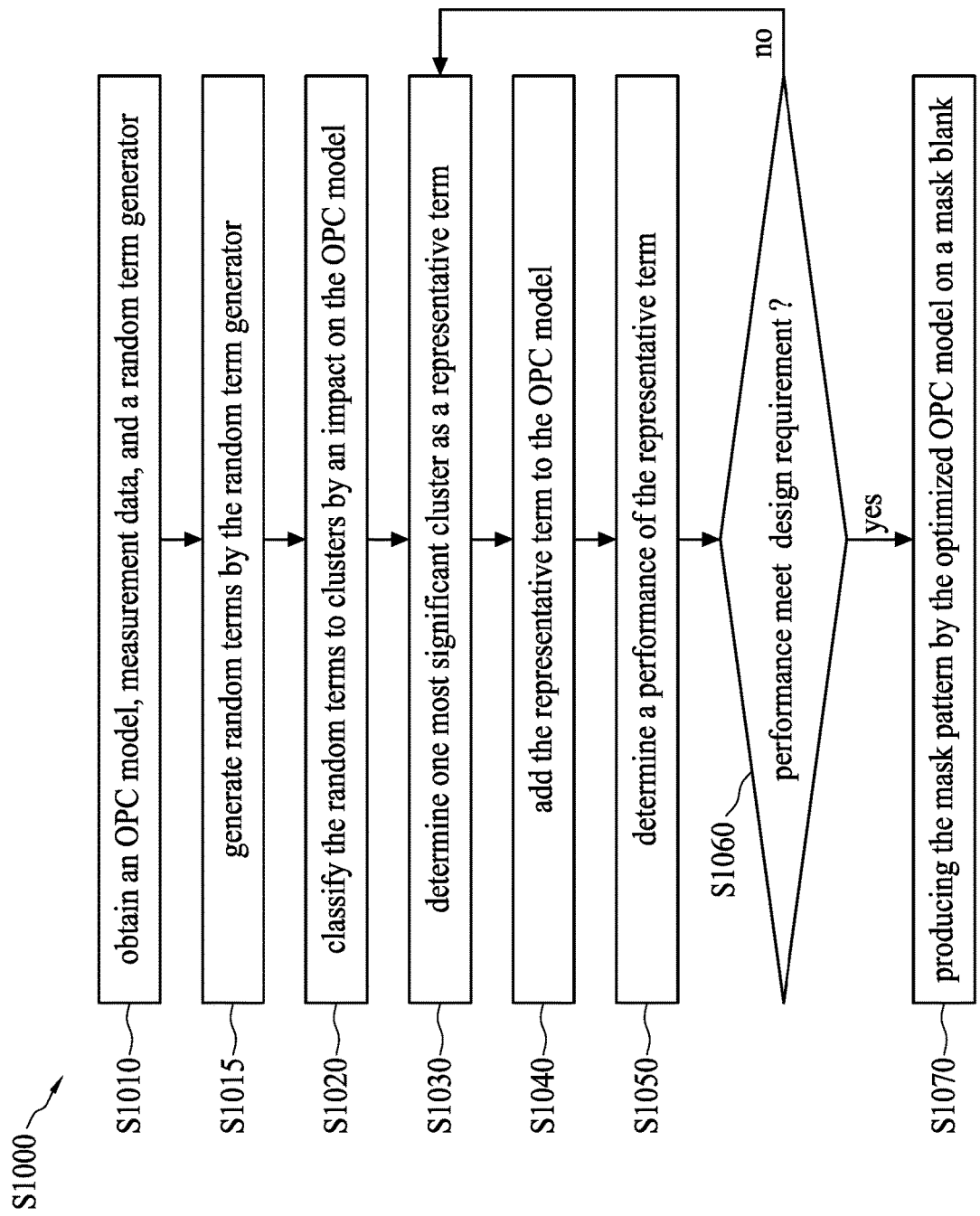
FIG. 6 illustrates a flow chart of a method for optimizing an optical proximity correction (OPC) model for a mask pattern of a photo mask in accordance with one or more embodiments of the present disclosure.

FIG. 6 illustrates a flow chart of a method S1000 for optimizing an optical proximity correction (OPC) model for a mask pattern of a photo mask in accordance with an embodiment of the present disclosure. The method includes, at S1010, obtaining an OPC model, measurement data, and a random term generator. Then, at S1015, random terms are generated by the random term generator. In operation S1020, the random terms are classified to clusters by an impact on the OPC model. The operation S1030 follows and determines one most significant cluster as a representative term. In the operation S1040, the representative term is added to the OPC model. Then a performance of the representative term is determined in operation S1050. At S1060, in response to the determination of the performance, the method automatically adjusts the representative term associated with the OPC model until the performance of the representative subset meets a design requirement. When the determination of the performance concludes that the performance of the representative term meets a design requirement, the OPC model is obtained as the optimized (OPC) model. Finally, the mask pattern by the optimized OPC model is produced on a mask blank at S1070.

Figure 7:
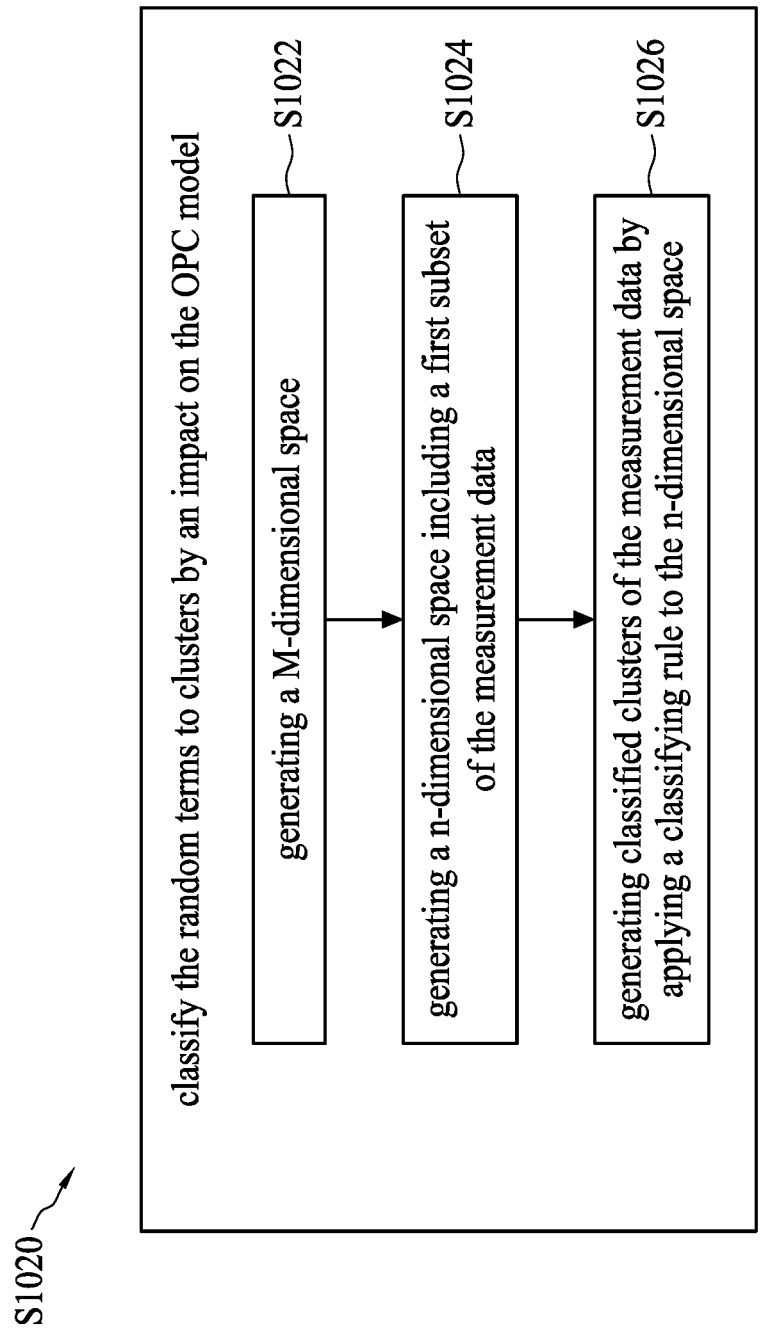
FIG. 7 illustrates a detailed flow chart of a method for classifying the random terms to clusters by an impact on the OPC model.

FIG. 7 illustrates a detailed flow chart of a method S1020 for classifying the random terms to clusters by an impact on the OPC model. The method includes, at S1022, an M-dimensional space is generated and the M-dimensional space includes the large number (N) of random terms. The operation S1024 follows when an n-dimensional space is generated that includes a first subset of the measurement data. Subsequently, at the operation S1026, classified clusters of the measurement data is generated by applying a classifying rule to the n-dimensional space.

Figure 8A:
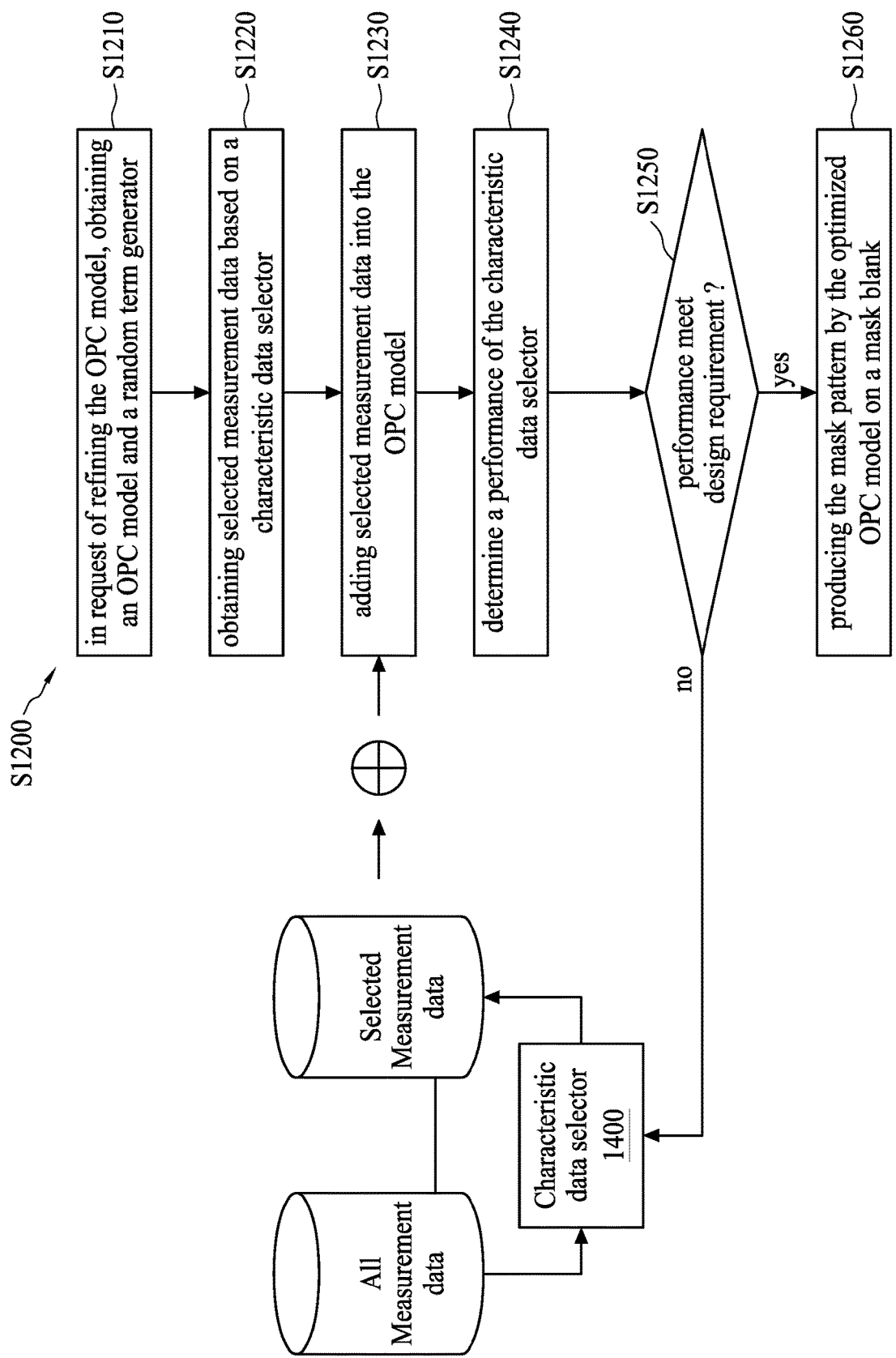
FIG. 8A illustrates another flow chart of a method for optimizing an OPC model for a mask pattern of a photo mask in accordance with one or more embodiments of the present disclosure.
Figure 8B:
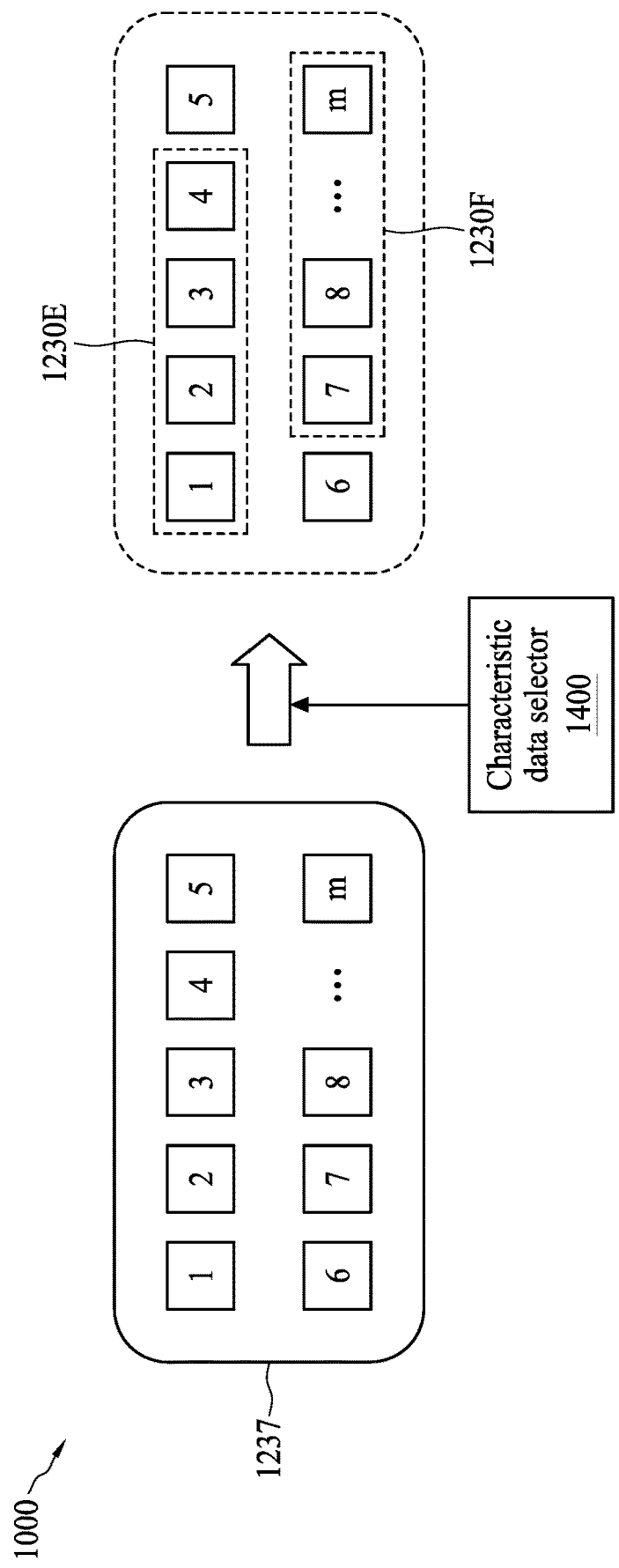
FIG. 8B illustrates the data processing in accordance with one or more embodiments of the present disclosure.

Another embodiment of the disclosure is shown in FIGS. 8A and 8B. After the first optimized model $(p_1=f_1+g_1)$ is obtained from the method S1000, if a different result is desired, another function $p_1$ can be used to generate new random terms by selecting a new subset of measurement data as input to the embodiment disclosed by the method S1000. Since the function $p_i$ is closer to an "ideal solution" meeting different design requirements/criteria resulting in the different result than $p_{i-1}$, the clustering of terms should be more accurate with model $p_i$. As such, with the more accurate clustering, a new OPC model $p_{i+1}$ is generated. In such a configuration, the remaining steps can be repeated until the final model is optimized to a desired level.

FIG. 8A illustrates a flow chart of the method S1200 for optimizing an optical proximity correction (OPC) model for a mask pattern of a photo mask in accordance with an embodiment of the present disclosure. The method includes, at S1210, in response to a request of refining the OPC model, obtaining an OPC model and a random term generator. In the operation of S1220, selected measurement data is obtained based on a characteristic data selector. Consequently, the selected measurement data is added into the OPC model. Then a performance of the characteristic data selector is determined in operation S1240. At S1250, in response to the determination of the performance, the characteristic data selector associated with the OPC model is automatically adjusted until the performance of the representative subset meets a design requirement. When the determination of the performance concludes that the performance of the representative term meets a design requirement, the OPC model is obtained as the optimized (OPC) model. Finally, the mask pattern by the optimized OPC model is produced on a mask blank at S1260

FIG. 8B illustrates the data processing in accordance with one or more embodiments of the present disclosure. In response to a request of refining the OPC model, the ML based model builder 1000 obtains an OPC model from a previous database and a random term generator. Then, the ML based model builder 1000 uses a characteristic data selector 1400 to select certain measurement data from all of the measurement data. As shown in FIG. 8B, one or more qualifying measurement data 1230E can be such as, data sets 1 through 4. In some alternative embodiments, the characteristic data selector 1400 identifies other measurement data 1230F such as, data sets 7 through m.

In some embodiments, the characteristic data selector 1400 of the ML based model builder 1000 selects one or more qualifying measurement data 1230E from each of the OPC clusters 1230. In some embodiments, the one or more qualifying measurement data 1230E are sorted in terms their impact on the OPC model. In some embodiments, the one or more qualifying measurement data 1230E and the other measurement data 1230F are consecutively arranged. In some embodiments, the one or more qualifying measurement data 1230E and the other measurement data 1230F are randomly arranged.

The characteristic data selector 1400 of the ML based model builder 1000 described herein utilizes machine learning systems that have been explicitly or implicitly trained to learn, determine or infer system needs, performance requirements, interdependencies of the terms, and dynamically determine or infer data points of the terms that achieve current and/or anticipated data matching requirements.

Figure 9A:
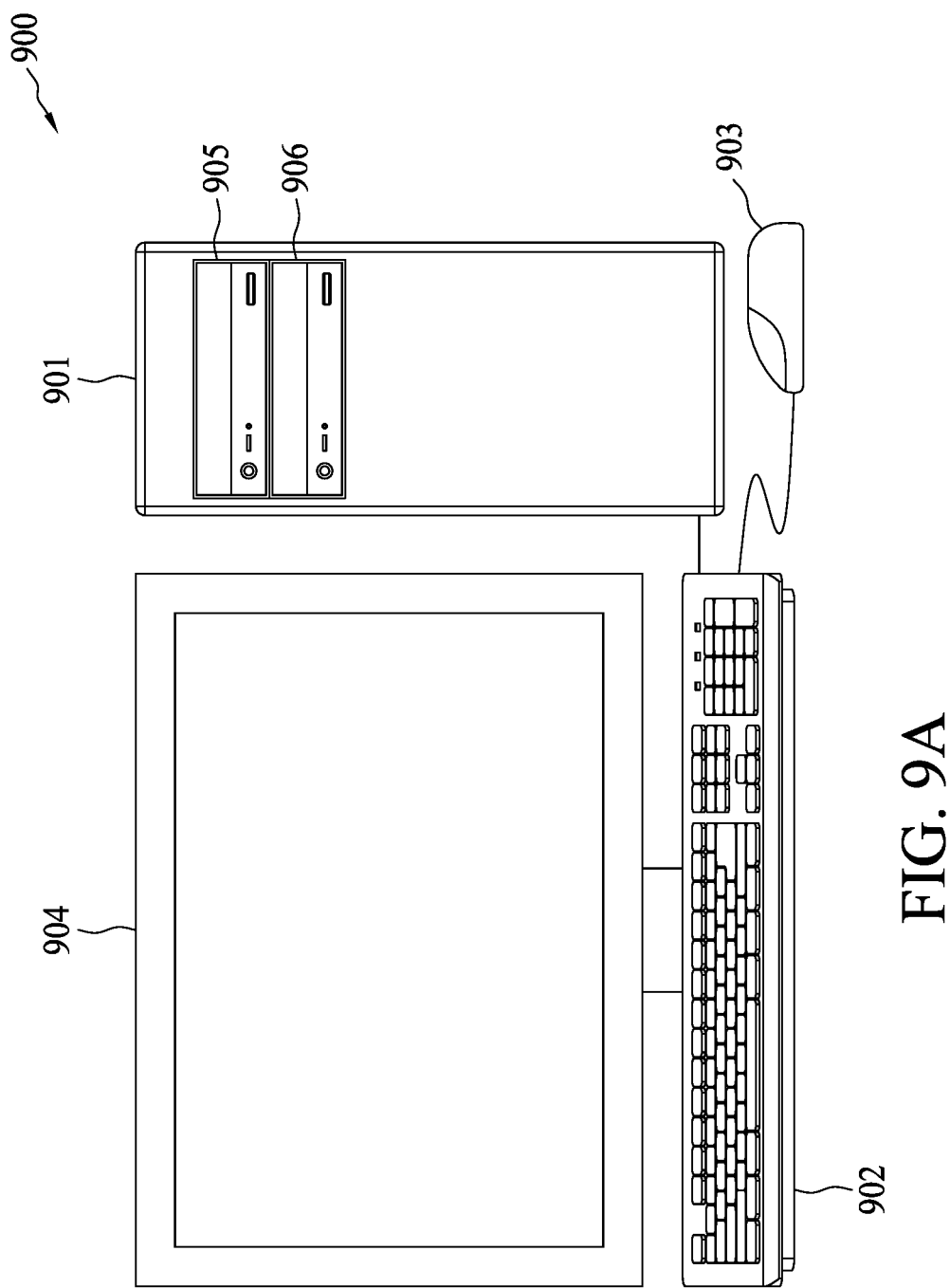
FIGS. 9A and 9B show a data analyzing apparatus according to one or more embodiments of the present disclosure.
Figure 9B:
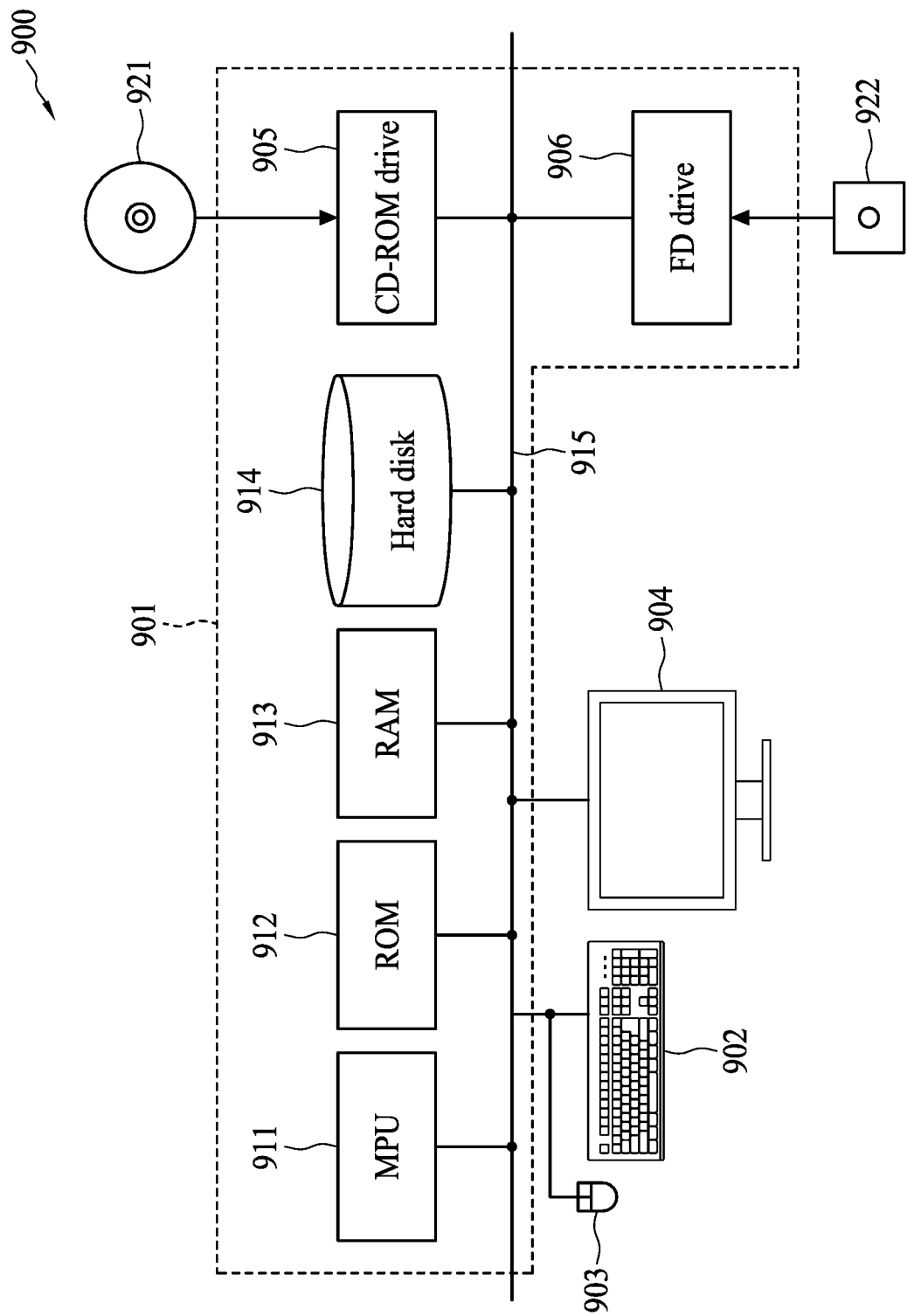

FIGS. 9A and 9B show a data analyzing apparatus according to an embodiment of the present disclosure. FIG. 9A is a schematic view of a computer system that executes the in-line source-mask optimization process described above. The foregoing embodiments may be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a local area network (LAN).

The program for causing the computer system 900 to execute the functions of the data analyzing apparatus in the foregoing embodiments may be stored in an optical disk 921 or a magnetic disk 922, which are inserted into the optical disk drive 905 or the magnetic disk drive 906, and be transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the data analyzing apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

The ML based model builder provides benefits of taking a new approaches utilizing machine learning technologies, when optimizing the optical proximity correction (OPC) model for a mask pattern of a photo mask. Particularly, the ML based model builder provides the physics of the process to be modeled by incorporating the domain knowledge in the selection process, thereby leading photo mask process in the lithographic system to a more physical and automated selection process, without any determination by the user required in the term selection process.

An embodiment of the disclosure is a method of optimizing an optical proximity correction (OPC) model for a mask pattern of a photo mask. First, an OPC model, measurement data and a random term generator are obtained. Subsequently, random terms in a M-dimensional space are generated by the random term generator. The random terms are then classified to clusters by applying a classifying rule. Then, a representative subset of the random terms is determined among the classified clusters. The representative subset are added to the OPC model. Subsequently, a performance of the representative subset on the OPC model is determined. In response to the determination of the performance, the representative subset associated with the OPC model is automatically adjusted until the performance of the representative subset meets a design requirement to obtain an optimized OPC model. Finally, the mask pattern by the optimized OPC model is produced on a mask blank.

In some embodiments, when classifying the random terms to clusters, a M-dimensional space is generated based on a number N of random terms. In some embodiments, when classifying the random terms to clusters, a n-dimensional space including a first subset of the measurement data is generated based on a plurality of sample points. In some embodiments, when classifying the random terms to clusters, classified clusters of the measurement data is generated by applying a classifying rule to the n-dimensional space. In some embodiments, when classifying the random terms to clusters, representative terms from each of the clusters are selected. In some embodiments, when determining a representative subset of the random terms, one or more representative terms from each of the clusters is selected. In some embodiments, when determining a representative subset of the random terms, the representative subset is selected based on impact to the OPC model. In some embodiments, the random terms include convoluted terms. In some embodiments, when classifying the random terms to clusters, the random terms are classified based on clustering, feature selection, subset selection, and dimensionality reduction. In some embodiments, when classifying the random terms to clusters, classified clusters of the measurement data selected from the group consisting of a geographic center method, a moving average method, a data sampling rate method, a data magnification factor method, a data smoothing filter method, and types of sensor method are generated. In some embodiments, when obtaining an OPC model, an optical model and a resist model are obtained.

Another embodiment of the disclosure is a method of optimizing an optical proximity correction (OPC) model for a mask pattern of a photo mask. In response to a request of refining the OPC model, an OPC model and a random term generator are obtained. Then, selected measurement data is obtained based on a characteristic data selector. Subsequently, adding selected measurement data into the OPC model. A performance of the OPC model is then determined. In response to the determination of the performance, the characteristic data selector associated with the OPC model is automatically adjusted until the performance of the characteristic data selector meets a design requirement to obtain an optimized OPC model. Finally, the mask pattern by the optimized OPC model is produced on a mask blank. In some embodiments, when obtaining selected measurement data, one or more qualifying measurement data sorted based on impact to the OPC model are obtained. In some embodiments, when obtaining selected measurement data, one or more randomly arranged qualifying measurement data are obtained. In some embodiments, when obtaining selected measurement data, selected measurement data based on a machine learning module is obtained.

According to another aspect of the present disclosure is a system of optimizing an optical proximity correction (OPC) model for a mask pattern of a photo mask. The system includes a memory that stores computer executable components and a processor that executes computer executable components stored in the memory. The computer executable components includes a M-dimensional space and a statistical learning component. The M-dimensional space generates optical model parameter vector data corresponding to attributes of a resist model parameter. The statistical learning component generates random terms in a M-dimensional space by the random term generator. The statistical learning component classifies the random terms to clusters by applying a classifying rule. The statistical learning component also determines a representative subset of the random terms among the classified clusters. The statistical learning component adds the representative subset to the OPC model. The statistical learning component also determines a performance of the representative subset on the OPC model. In response to the determination of the performance, the statistical learning component automatically adjusts the representative subset associated with the OPC model until the performance of the representative subset meets a design requirement. The statistical learning component then obtains the OPC model as the optimized OPC model. In some embodiments, the OPC model includes an optical model that includes optical parameters associated with a lithography scanner tool. In some embodiments, the OPC model includes a resist model based on an optical image and a mask pattern dependent functions associated with a lithography scanner tool. In some embodiments, the statistical learning component further includes a n-dimensional vector based on convoluted terms. In some embodiments, the statistical learning component further includes policy data representing a weighting policy associated with a machine learning module.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of optimizing an optical proximity correction (OPC) model for a mask pattern of a photo mask, the method comprising:
    obtaining an OPC model, measurement data and a random term generator;
    generating random terms in a M-dimensional space by the random term generator;
    classifying the random terms to clusters by applying feature selection, subset selection, and dimensionality reduction;
    determining a representative subset of the random terms, wherein the representative subset comprises representative terms from the classified clusters, and wherein the representative terms are selected based on an impact of the representative terms on the OPC model and comprises the representative term having most significant effect on the OPC model;
    adding the representative subset to the OPC model;
    determining a performance of the OPC model with the added representative subset;
    in response to the determination that the performance does not meet a design requirement, automatically adjusting the added representative subset until the performance of the OPC model with the added representative subset meets the design requirement and the OPC model with the added representative subset is obtained as an optimized OPC model; and
    producing the mask pattern, using the optimized OPC model, on a mask blank.

2. The method of claim 1, wherein classifying the random terms to clusters further includes generating a M-dimensional space based on a number N of random terms.

3. The method of claim 1, wherein classifying the random terms to clusters further includes generating a n-dimensional space including a first subset of the measurement data based on a plurality of sample points.

4. The method of claim 3, wherein classifying the random terms to clusters further includes generating classified clusters of the measurement data by applying a classifying rule to the n-dimensional space.

5. The method of claim 1, wherein classifying the random terms to clusters includes selecting representative terms from each of the clusters.

6. The method of claim 1, wherein determining the representative subset of the random terms includes selecting one or more representative terms from the clusters based on the impact of the representative terms on the OPC model.

7. The method of claim 1, wherein the random terms include convoluted terms.

8. The method of claim 1, wherein classifying the random terms to clusters includes generating classified clusters of the measurement data selected from the group consisting of a geographic center method, a moving average method, a data sampling rate method, a data magnification factor method, a data smoothing filter method, and types of sensor method.

9. The method of claim 1, wherein the OPC model comprises an optical model and a resist model, wherein the optical model defines performance of optical components associated with a lithography scanner tool and the resist model defines distortion of an image in a photoresist layer.

10. The method of claim 1, further comprising:
    applying the OPC model on a mask pattern of a photo mask to produce simulated measurement data; and
    comparing the simulated measurement data with the measurement data to verify the OPC model.

11. The method of claim 1, wherein automatically adjusting the representative subset comprises performing steps of:
    sorting the representative terms based on impact on the OPC model; and
    adding a representative term, having most significant impact, to the representative subset until the performance of the representative subset meets the design requirement.

12. A method of optimizing an optical proximity correction (OPC) model for a mask pattern of a photo mask, the method comprising:
    in response to a request of refining the OPC model, obtaining the OPC model and a random term generator;
    obtaining selected measurement data from a characteristic data selector that sorts a plurality of measurement data in terms of impact to the OPC model and selects one or more measurement data having most significant impact on the OPC model as the selected measurement data;
    adding the selected measurement data into the OPC model;
    determining a performance of the OPC model with the selected measurement data;
    in response to the determination that the performance does not meet a design requirement, automatically adjusting the characteristic data selector until the performance of the OPC model with the selected measurement data obtained by the adjusted characteristic data selector meets the design requirement and the OPC model with the added measurement data is obtained as an optimized OPC model; and
    producing the mask pattern, using the optimized OPC model, on a mask blank.

13. The method of claim 12, wherein obtaining selected measurement data includes obtaining selected measurement data based on a machine learning module.

14. The method of claim 12, wherein the OPC model comprises an optical model and a resist model, wherein the optical model defines performance of optical components associated with a lithography scanner tool and the resist model defines distortion of an image in a photoresist layer.

15. The method of claim 12, further comprising:
    applying the OPC model on a mask pattern of a photo mask to produce simulated measurement data.

16. A system of optimizing an optical proximity correction (OPC) model for a mask pattern of a photo mask, comprising:
    a random term generator;
    a memory that stores computer executable components;
    a processor that executes computer executable components stored in the memory, wherein the computer executable components comprise:
        a statistical learning component that:
            generates random terms in a M-dimensional space by the random term generator;

classifies the random terms to clusters by applying feature selection, subset selection, and dimensionality reduction;

determines a representative subset of the random terms, wherein the representative subset comprises representative terms from the classified clusters, and wherein the representative terms are selected based on an impact of the representative terms on the OPC model and comprises the representative term having most significant effect on the OPC model;

adds the representative subset to the OPC model;

determines a performance of the OPC model with the added representative subset;

in response to the determination that the performance does not meet a design requirement, automatically adjusts the added representative subset until the performance of the OPC model with the added representative subset meets the design requirement; and obtains the OPC model with the added representative subset as an optimized OPC model.

17. The system of claim 16, wherein the OPC model includes an optical model including optical parameters associated with a lithography scanner tool.

18. The system of claim 16, wherein the OPC model includes a resist model based on an optical image and a mask pattern dependent functions associated with a lithography scanner tool.

19. The system of claim 16, wherein the statistical learning component further includes a n-dimensional vector based on convoluted terms.

20. The system of claim 16, wherein the statistical learning component further includes policy data representing a weighting policy associated with a machine learning module.

* * * * *